United States Patent
Chua et al.

(10) Patent No.: US 8,081,521 B2
(45) Date of Patent: Dec. 20, 2011

(54) TWO BITS PER CELL NON-VOLATILE MEMORY ARCHITECTURE

(75) Inventors: Chee T. Chua, Fremont, CA (US); Kameswara K. Rao, San Jose, CA (US); Vithal R. Rao, San Jose, CA (US); Jawji Chen, Fremont, CA (US); Da-Guang Yu, Fremont, CA (US); J. Eric Ruetz, Soquel, CA (US); Stephen Fung, Cupertino, CA (US)

(73) Assignee: MoSys, Inc., Santa Clara, CA (US)

( * ) Notice: Subject to any disclaimer, the term of this patent is extended or adjusted under 35 U.S.C. 154(b) by 143 days.

(21) Appl. No.: 12/370,718

(22) Filed: Feb. 13, 2009

(65) Prior Publication Data

US 2010/0208530 A1     Aug. 19, 2010

(51) Int. Cl.
*G11C 7/00*   (2006.01)
(52) U.S. Cl. ....... 365/189.011; 365/185.29; 365/185.03; 365/189.16; 365/189.15
(58) Field of Classification Search ............. 365/185.29, 365/189.011, 185.03, 189.16, 189.15
See application file for complete search history.

(56) References Cited

U.S. PATENT DOCUMENTS

| | | | | |
|---|---|---|---|---|
| 6,134,140 A | * | 10/2000 | Tanaka et al. | 365/185.03 |
| 2005/0018519 A1 | * | 1/2005 | Nii | 365/227 |
| 2008/0247257 A1 | * | 10/2008 | Brown | 365/227 |

* cited by examiner

*Primary Examiner* — Fernando N. Hidalgo
(74) *Attorney, Agent, or Firm* — Luedeka, Neely & Graham, P.C.

(57) ABSTRACT

A memory circuit for holding a single binary value. A first bit cell holds one of a logical high value and a logical low value, and a second bit cell also holds one of a logical high value and a logical low value. Circuitry is provided for placing a logical high value in the first bit cell when the binary value in the memory circuit is to be a logical high value, and circuitry is provided for placing a logical high value in the second bit cell when the binary value in the memory circuit is to be a logical low value. In this manner, a logical high value exists within the memory circuit, whether the single binary value within the memory circuit is a logical high value or a logical low value. The difference between the two values of the binary value is which of the two bit cells holds the logical high value. Thus, this memory circuit can be sensed without the use of a sense amplifier.

14 Claims, 6 Drawing Sheets

TWO BITS PER CELL NON-VOLATILE MEMORY ARCHITECTURE

FIELD

This invention relates to the field of integrated circuits. More particularly, this invention relates to non-volatile memory formed in a semiconducting material, and circuits that can be used to provide the voltages to program, read, and erase such memory.

BACKGROUND

Memory devices are typically implemented as integrated circuit devices. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Memory devices take several different forms, including random access memory, read only memory, and programmable memory, to name just a few. There are numerous different varieties and blends of all of these different types of memory. One type of memory is called non-volatile memory. Non-volatile memory does not require a constant source of power in order to retain the data that is stored within it. Thus, non-volatile memory is well adapted for applications that do not have a large power supply available to them, such as mobile applications.

However, non-volatile memory has traditionally been somewhat slower than other kinds of memory, for a variety of different reasons. One aspect of the speed at which non-volatile memory operates is the speed at which the sense amplifier and sensing scheme operate. Other aspects of the design of a non-volatile memory also impact the speed of operation of the memory.

What is needed, therefore, are new designs for non-volatile memory that overcome various problems, such as those described above, at least in part.

SUMMARY

The above and other needs are met by a memory circuit for holding a single binary value. A first bit cell holds one of a logical high value and a logical low value, and a second bit cell also holds one of a logical high value and a logical low value. Circuitry is provided for placing a logical high value in the first bit cell when the binary value in the memory circuit is to be a logical high value, and circuitry is provided for placing a logical high value in the second bit cell when the binary value in the memory circuit is to be a logical low value.

In this manner, a logical high value exists within the memory circuit, whether the single binary value within the memory circuit is a logical high value or a logical low value. The difference between the two values of the binary value is which of the two bit cells holds the logical high value. Thus, this memory circuit can be sensed without the use of a sense amplifier.

In various embodiments according to this aspect of the invention, circuitry is provided for placing a logical low value in the first bit cell when the binary value in the memory circuit is to be a logical low value, and circuitry is provided for placing a logical low value in the second bit cell when the binary value in the memory circuit is to be a logical high value. In some embodiments circuitry is provided for preventing the first bit cell from holding a logical high value when the second bit cell holds a logical high value. In some embodiments circuitry is provided for preventing the second bit cell from holding a logical high value when the first bit cell holds a logical high value. In some embodiments circuitry is provided for sensing which of the first bit cell and the second bit cell is holding a logical high value. In some embodiments circuitry is provided for sensing which of the first bit cell and the second bit cell is holding a logical low value. In some embodiments circuitry is provided for erasing the memory circuit by placing a logical low value in both of the first bit cell and the second bit cell.

According to another aspect of the invention there is described a method for holding a single binary value using a first bit cell and a second bit cell by placing a logical high value in the first bit cell when the binary value is to be a logical high value, and placing a logical high value in the second bit cell when the binary value is to be a logical low value.

In various embodiments according to this aspect of the invention, a logical low value is placed in the first bit cell when the binary value is to be a logical low value, and a logical low value is placed in the second bit cell when the binary value is to be a logical high value. In some embodiments the first bit cell is prevented from holding a logical high value when the second bit cell holds a logical high value. In some embodiments the second bit cell is prevented from holding a logical high value when the first bit cell holds a logical high value. In some embodiments the first bit cell and the second bit cell are sensed to determine which is holding a logical high value. In some embodiments the first bit cell and the second bit cell are sensed to determine which is holding a logical low value. In some embodiments the memory circuit is erased by placing a logical low value in both of the first bit cell and the second bit cell.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The embodiments of the present invention use two single-transistor flash memory cells as a single non-volatile memory cell to store a single bit of data. These circuits are generally referred to herein as two-cells-per-bit memory circuits. The contents of these circuits can be read without using a sense amplifier. Thus, all of the concerns about the performance of the sense amplifier, lack of sensing window, sense amplifier offset, and so forth can be ignored in the embodiments of the circuits according to the present invention. The designs generally described herein are compatible with many different fabrication processes. In some embodiments the designs are implemented using 130 nanometer CMOS technology, with a vdd of from about 1.08 volts to about 1.32 volts, and operating within a temperature range of from about −40 C. to about 125 C.

The circuits according to the present invention have a first cell that is designated as the right-hand cell, and a second cell that is designated as the left-hand cell. These terms are used for convenience only, and of course, such designations are wholly dependent upon the perspective of the viewer. The two-cells-per-bit memory circuit stores its data value on either the single-transistor memory cell on the right or the single-transistor memory cell on the left. The appropriate selection of either the right-hand or left-hand cell is based on the value of the data bit to be stored, as described in more detail hereafter.

Conceptually, if there is a logical high charge on a first of the two cells, then the overall memory circuit is interpreted to be storing a logical high value—or in other words a one. If, on the other hand, there is a logical high charge on the second of the two cells, then the memory circuit is interpreted to be storing a logical low value—or in other words a zero. Thus, a sense amplifier is not required, because the circuit stores a high charge whether it is set at a logical one or a logical zero—the difference between the two states is the cell (right or left) in which the relative high charge is stored.

Before programming either of the two cells with a data bit, both of the memory cells are erased. If a logical high value of one is to be stored, then the memory cell on the right-hand side is programmed (according to the designations followed herein. It is appreciated that in alternate designations, this could be reversed). If a logical low value of zero is to be stored, then the memory cell on the left-hand side is programmed (according to the designations followed herein. It is appreciated that in alternate designations, this could be reversed).

Figure 1:
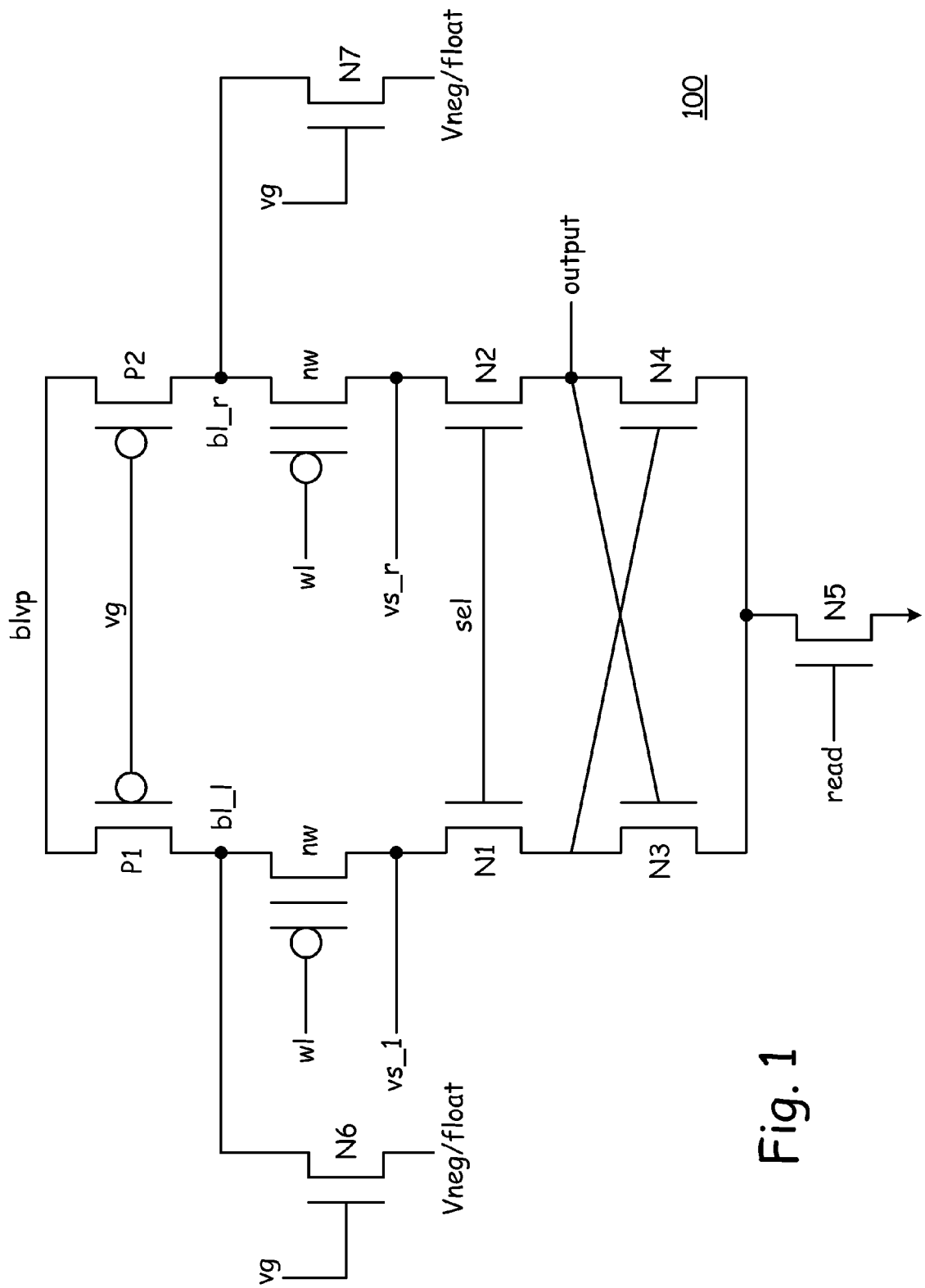
FIG. 1 is a schematic diagram of a two-cells-per-bit non-volatile memory circuit according to an embodiment of the present invention.

With reference now to FIG. 1, the basic transistors, interconnections, and inputs for one embodiment of the non-volatile memory cell 100 according to the present invention are depicted. During an erase operation, transistors P1 and P2 pass a high voltage to both of the bit lines bl_l and bl_r (where the _l indicates a given element for the left-hand cell, and the _r indicates a given element for the right-hand cell). At the same time, the n well contacts nw_l and nw_r and the voltage source lines vs_l and vs_r are also supplied with high voltage, while the word line wl is held at ground. The N1 and N2 NMOS transistors act as protection devices during an erase operation.

During a programming operation, a negative voltage is selectively passed through just one of the two transistors N6 or N7. Circuits for providing the negative voltage are described hereafter. When the programmed value is to be a logical one, then the bit line bl_r receives the negative voltage and the bit line bl_l floats. When the programmed value is to be a logical zero, then the bit line bl_l receives the negative voltage and the bit line bl_r floats. When the voltage applied on the word line wl is nominally five volts and the voltage applied to the n well contact nw is nominally three volts, then the cell that gets programmed (be it the left-hand or the right-hand cell) is that cell for which the associated bit line (be it bl_l or bl_r) receives the negative voltage. The transistor N5 cuts off the drainage of any leakage current during a programming operation.

For a read operation, the bitlines bl_l and bl_r are both brought to vdd through the transistors P1 and P2, respectively, the word lines wl are brought to ground, and the n well contacts nw are both raised to vdd. When the read line and select line sel are high (all of N1, N2, and N5 are open), the value on the output line will be one (high) if the right-hand-side memory cell is programmed, and the value on the output line will be zero (low) if the left-hand-side memory cell is programmed.

Figure 2:
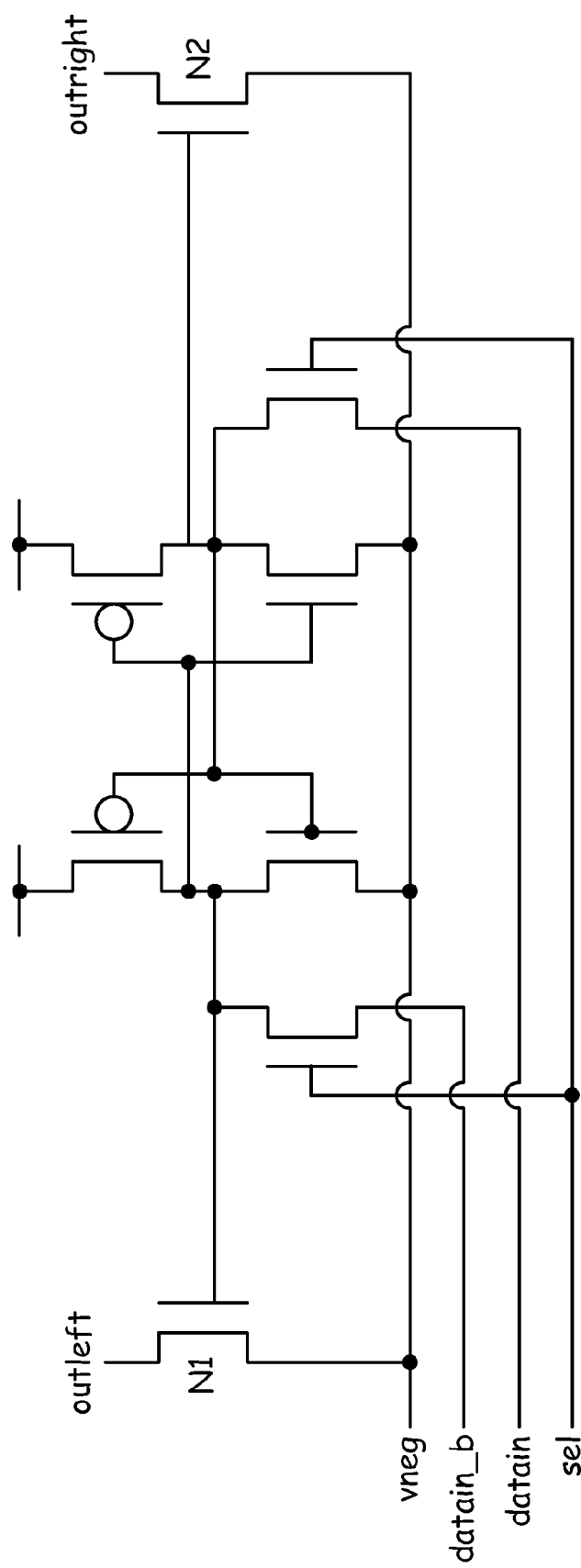
FIG. 2 is a schematic diagram of a negative/floating switch circuit according to an embodiment of the present invention.

FIG. 2 depicts a negative switch circuit 200 that supplies negative voltage on one output and floats on the other output (and vice-versa), which circuit can be used to program the two-cells-per-bit non-volatile memory circuits described herein (such as circuit 100, depicted in FIG. 1). When the circuit 200 is selected (high voltage applied to the sel line) and the data_in line is high, N2 is on and N1 is off. In this situation, the line Out_right is negative (receiving the negative voltage from vneg), and the line out_left is floating. When data_in is low, N1 is on and N2 is off, and out_left is negative (receiving the negative voltage from vneg) and out_right is floating.

Figure 3:
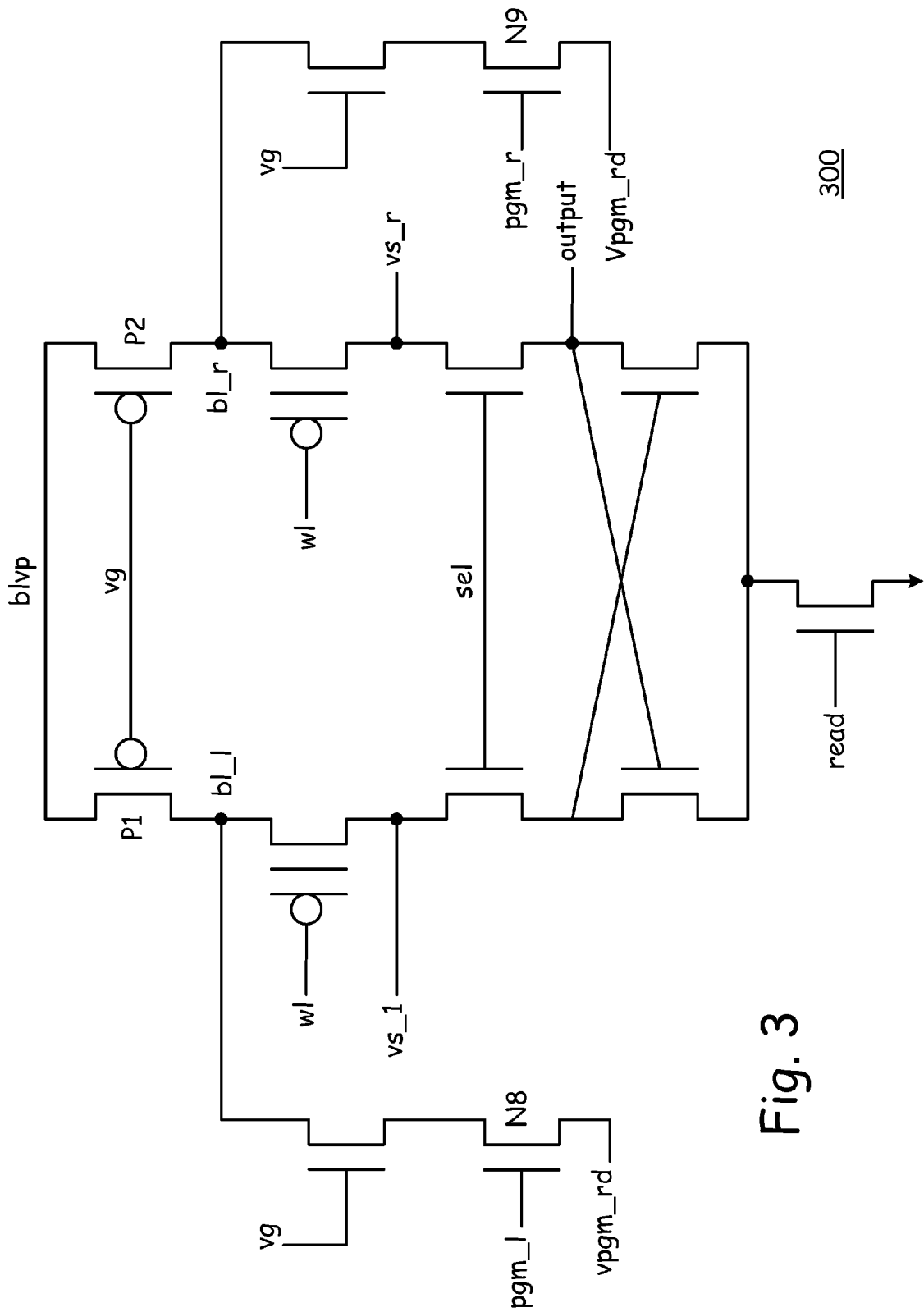
FIG. 3 is a schematic diagram of a two-cells-per-bit non-volatile memory circuit according to an embodiment of the present invention.

FIG. 3 depicts a different embodiment of a two-cell-per-bit non-volatile memory circuit 300. Whereas the embodiment 100 depicted in FIG. 1 supplies the read and erase voltages through transistors P1 and P2, in the embodiment 300 depicted in FIG. 3, only the erase voltage goes through the transistors P1 and P2, and the program and read voltages pass through the transistors N8 and N9. This resolves a situation when the threshold voltages of P1 and P2 are too high to pass a vdd of 1.08 volts (for example). With the program lines pgm_l and pgm_r each receiving three volts during a read operation, there is no problem in passing a vdd of 1.08 volts through the N8 and N9 transistors to the bit lines bl_l and bl_r. All three of the cell operations, erase, program, and read, are the same as generally described above in regard to the embodiment of the circuit 100 depicted in FIG. 1.

Figure 4:
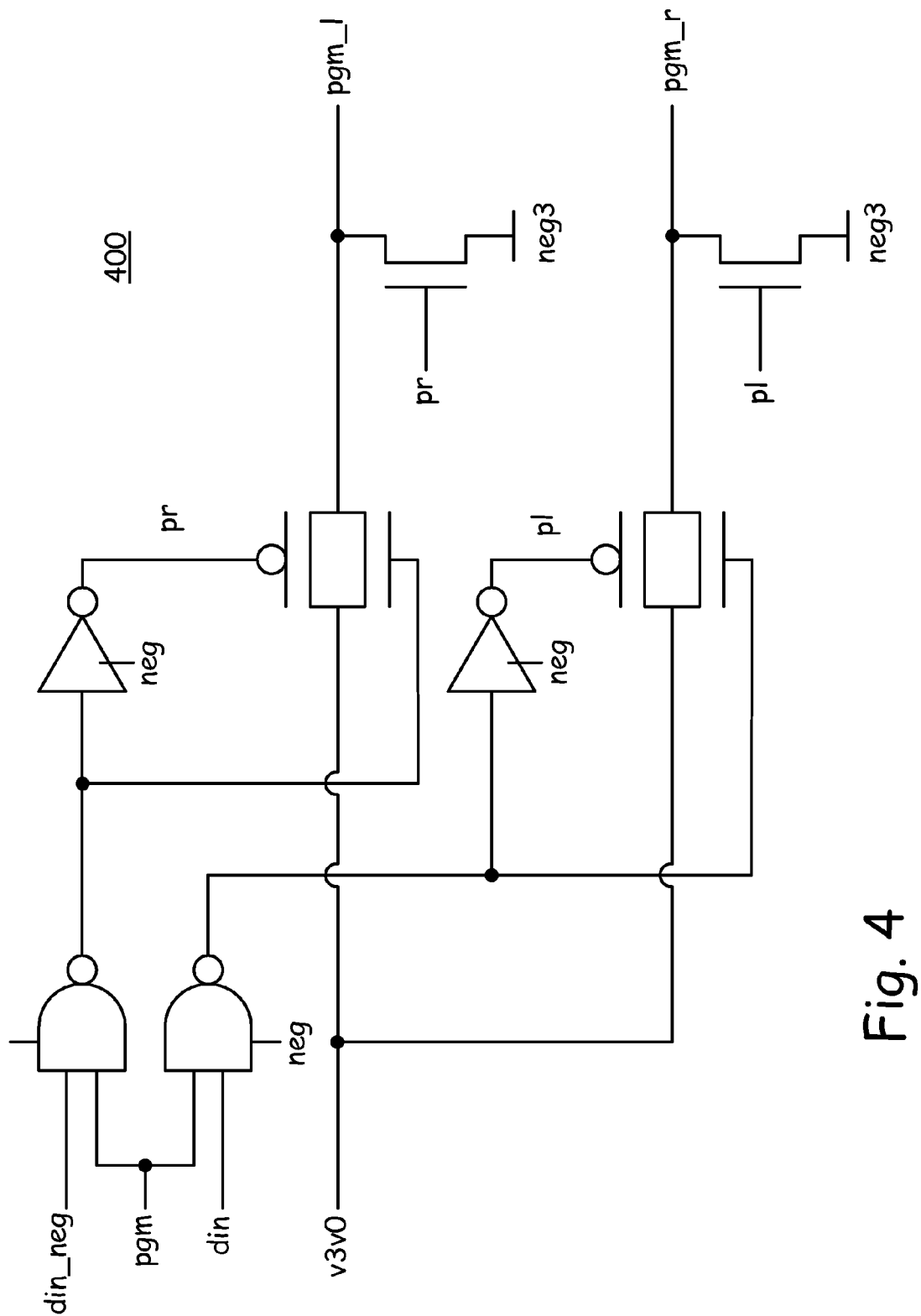
FIG. 4 is a schematic diagram of a negative/positive switch circuit according to an embodiment of the present invention.

FIG. 4 depicts another embodiment of a circuit 400 that provides a negative voltage on one side, pgm_l, and a positive voltage on the other side, pgm_r, or vice-versa, based on the signal applied to the d_in line. The circuit 400 is used for controlling and passing a voltage for programming one cell and inhibiting the other cell of a two-cells-per-bit circuit, such as circuit 300 described above. The bit line (bl_l or bl_r) on the cell to be programmed (either the left-hand cell or the right-hand cell) receives the negative voltage, while the bit line of the other cell is floated.

Figure 5:
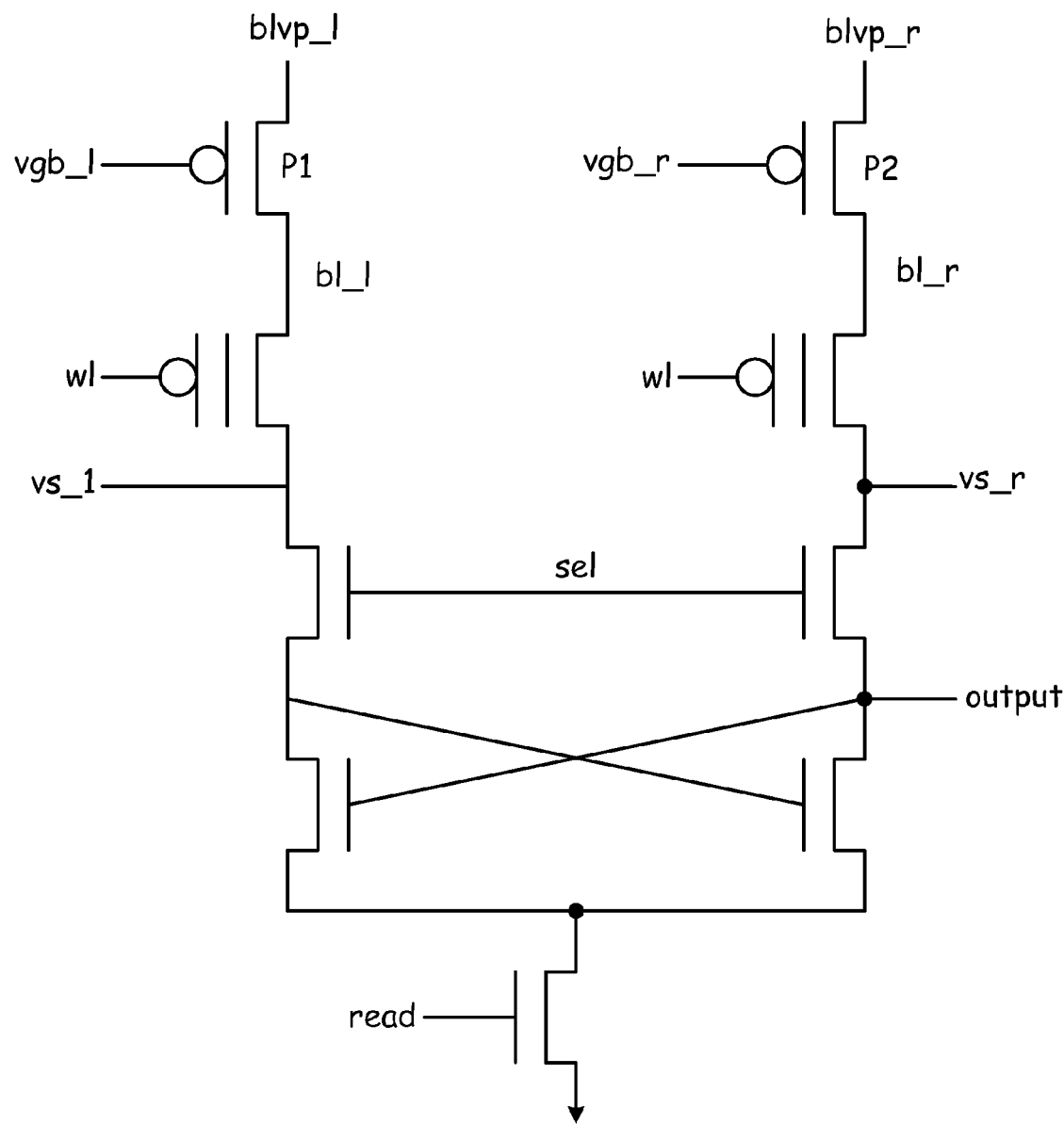
FIG. 5 is a schematic diagram of a two-cells-per-bit non-volatile memory circuit according to an embodiment of the present invention.

FIG. 5 depicts yet another embodiment of a two-cells-per-bit non-volatile memory circuit 500. Instead of supplying all of the voltages needed for the read, write, and erase operations through different lines of the circuit 500, all voltages for the three operations are supplied through a single path. In this embodiment, the gates of the transistors P1 and P2 are biased so as to pass a high voltage for the erase operation, a negative voltage for the program operation, and vdd for the read operation. These voltages can be supplied by the negative switch circuits described herein, for example. The voltages applied to the other nodes are the same as described above in regard to the two other embodiments of the two-cells-per-bit circuit, 100 and 300.

Figure 6:
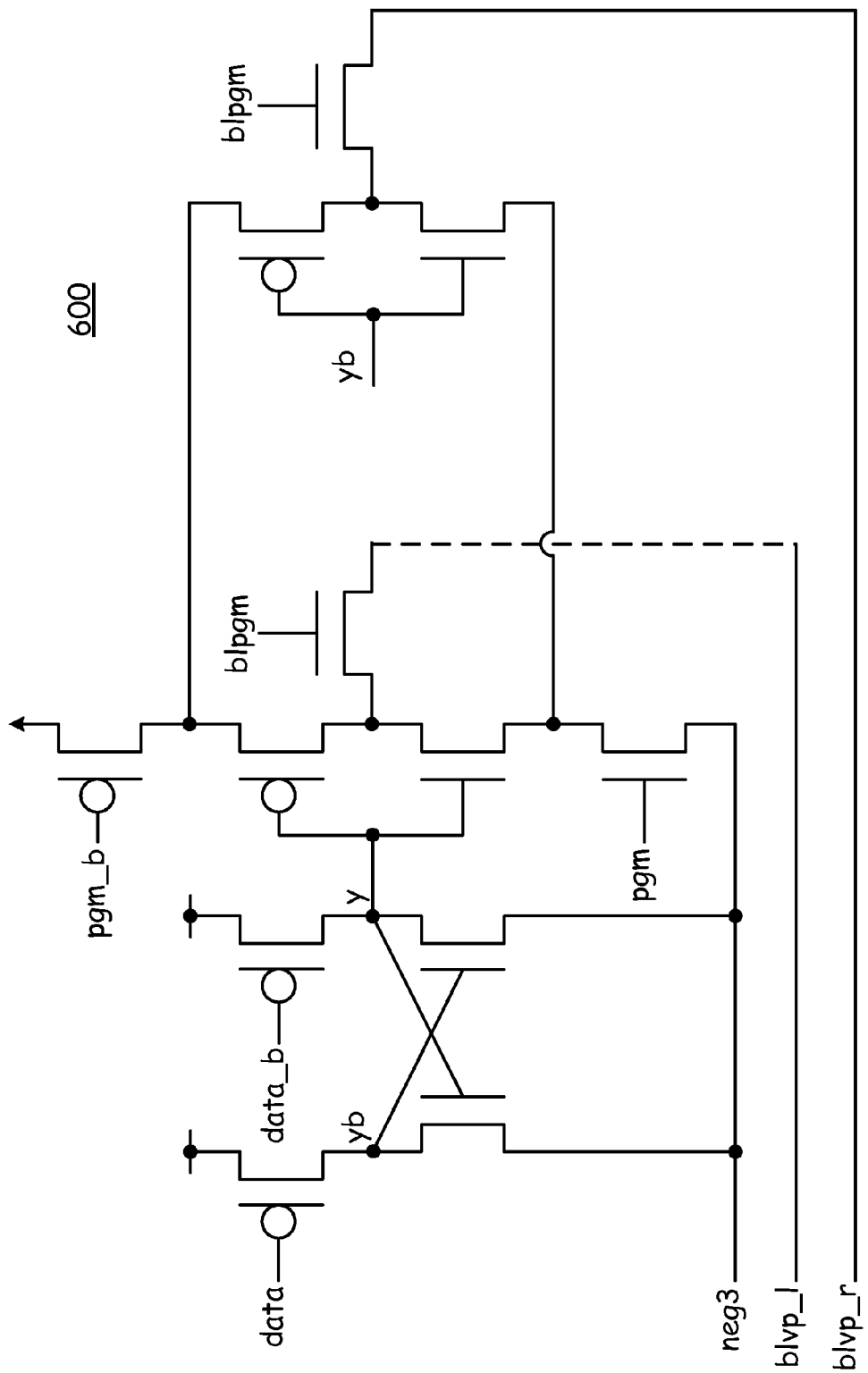
FIG. 6 is a schematic diagram of a negative/floating switch circuit according to an embodiment of the present invention.

FIG. 6 depicts another embodiment of a circuit 600 that provides a negative voltage on one line (one of either blvp_l or blvp_r) and a zero voltage on the other line (the other of blvp_l or blvp_r), based on the data input signal. The level shifter outputs a voltage from a negative voltage up to vdd to control the second stage of the circuit. The second stage then puts a negative voltage on one line (such as blvp_l, for example) and a zero voltage on the other line (such as blvp_r, for example), or vice versa. The bit line programming line blpgm is on only during a program operation.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A memory circuit for holding a single binary value, the memory circuit comprising:
    a two-bit per cell non-volatile memory cell,
    a first bit cell of the two-bit memory cell for holding one of a logical high value and a logical low value,
    a second bit cell of the two-bit memory cell for holding one of a logical high value and a logical low value,
    circuitry for storing a logical high value in the first bit cell when the binary value in the memory circuit is to be a logical high value, and
    circuitry for storing a logical high value in the second bit cell when the binary value in the memory circuit is to be a logical low value.

2. The memory circuit of claim 1, further comprising:
    circuitry for storing a logical low value in the first bit cell when the binary value in the memory circuit is to be a logical low value, and
    circuitry for storing a logical low value in the second bit cell when the binary value in the memory circuit is to be a logical high value.

3. The memory circuit of claim 1, further comprising circuitry for preventing the first bit cell from holding a logical high value when the second bit cell holds a logical high value.

4. The memory circuit of claim 1, comprising circuitry for preventing the second bit cell from holding a logical high value when the first bit cell holds a logical high value.

5. The memory circuit of claim 1, further comprising circuitry for sensing which of the first bit cell and the second bit cell is holding a logical high value.

6. The memory circuit of claim 1, further comprising circuitry for sensing which of the first bit cell and the second bit cell is holding a logical low value.

7. The memory circuit of claim 1, further comprising circuitry for erasing the memory circuit by storing a logical low value in both of the first bit cell and the second bit cell.

8. A method for operating a memory circuit holding a single binary value using a two-bit per cell non-volatile memory cell, the method comprising the steps of:
    storing a logical high value in a first bit cell of the two-bit memory cell when the binary value is to be a logical high value, and
    storing a logical high value in a second bit cell of the two-bit memory cell when the binary value is to be a logical low value.

9. The method of claim 8, further comprising the steps of:
    storing a logical low value in the first bit cell when the binary value is to be a logical low value, and
    storing a logical low value in the second bit cell when the binary value is to be a logical high value.

10. The method of claim 8, further comprising the step of preventing the first bit cell from holding a logical high value when the second bit cell holds a logical high value.

11. The method of claim 8, further comprising the step of preventing the second bit cell from holding a logical high value when the first bit cell holds a logical high value.

12. The method of claim 8, further comprising the step of sensing which of the first bit cell and the second bit cell is holding a logical high value.

13. The method of claim 8, further comprising the step of sensing which of the first bit cell and the second bit cell is holding a logical low value.

14. The method of claim 8, further comprising the step of erasing the memory circuit by storing a logical low value in both of the first bit cell and the second bit cell.

* * * * *